(12) United States Patent
Kassai et al.

(10) Patent No.: US 11,619,693 B2
(45) Date of Patent: Apr. 4, 2023

(54) MAGNETIC RESONANCE IMAGING APPARATUS

(71) Applicant: CANON MEDICAL SYSTEMS CORPORATION, Tochigi (JP)

(72) Inventors: Yoshimori Kassai, Nasushiobara (JP); Masao Yui, Otawara (JP)

(73) Assignee: CANON MEDICAL SYSTEMS CORPORATION, Tochigi (JP)

( * ) Notice: Subject to any disclaimer, the term of this patent is extended or adjusted under 35 U.S.C. 154(b) by 0 days.

(21) Appl. No.: 17/643,536

(22) Filed: Dec. 9, 2021

(65) Prior Publication Data

US 2022/0236354 A1   Jul. 28, 2022

(30) Foreign Application Priority Data

Jan. 22, 2021  (JP) .............................. JP2021-008512

(51) Int. Cl.
   *G01R 33/48*  (2006.01)
   *G01R 33/50*  (2006.01)

(52) U.S. Cl.
   CPC ..... *G01R 33/4822* (2013.01); *G01R 33/4816* (2013.01); *G01R 33/50* (2013.01)

(58) Field of Classification Search
   CPC . G01R 33/4816; G01R 33/4822; G01R 33/50
   See application file for complete search history.

(56) References Cited

U.S. PATENT DOCUMENTS

| 2008/0012566 A1* | 1/2008 | Pineda .............. G01R 33/5611 324/309 |
| 2011/0280456 A1* | 11/2011 | Sussman ........... G01R 33/5608 382/131 |
| 2015/0369892 A1* | 12/2015 | Yang ................. G01R 33/4833 324/309 |
| 2016/0202338 A1 | 7/2016 | Kimura |
| 2017/0363699 A1 | 12/2017 | Ookawa |
| 2019/0346525 A1 | 11/2019 | Obara et al. |

FOREIGN PATENT DOCUMENTS

| JP | 2016-123865 A | 7/2016 |
| JP | 2017-225501 A | 12/2017 |
| JP | 2019-195421 A | 11/2019 |

\* cited by examiner

*Primary Examiner* — Gregory H Curran
(74) *Attorney, Agent, or Firm* — Oblon, McClelland, Maier & Neustadt, L.L.P.

(57) ABSTRACT

A magnetic resonance imaging apparatus according to an embodiment includes processing circuitry. The processing circuitry acquires an echo signal generated for each of intervals of repetition time by applying an excitation pulse to a subject at the intervals of repetition time, and acquires data of a plurality of trajectories set for a k-space using the echo signals. The processing circuitry acquires a plurality of echo signals by setting echo time to lengths different between a plurality of periods of repetition time and acquires data of the same trajectory using the echo signals, and the echo time serves as time from application of the excitation pulse to generation of the echo signal.

11 Claims, 7 Drawing Sheets

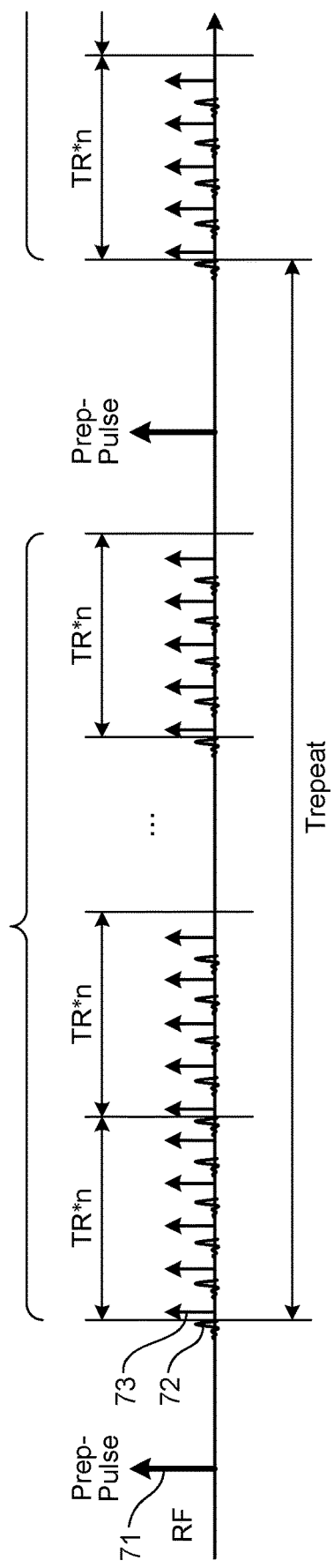

MAGNETIC RESONANCE IMAGING APPARATUS

CROSS-REFERENCE TO RELATED APPLICATIONS

This application is based upon and claims the benefit of priority from Japanese Patent Application No. 2021-008512, filed on Jan. 22, 2021; the entire contents of which are incorporated herein by reference.

FIELD

Embodiments described herein relate generally to a magnetic resonance imaging apparatus.

BACKGROUND

Conventionally, a technique called "ultra short TE" (UTE) is known as a technique relating to magnetic resonance imaging (MRI) apparatuses.

UTE is a technique of acquiring an echo signal directly after an excitation pulse is applied to a subject, acquiring data of a k-space by radial acquisition using the echo signal, and generating an image. UTE is capable of drawing tissue having a short T2 or T2* relaxation time, such as a joint and a lung field, by setting echo time (TE) to a short time, for example, less than 0.1 ms. Echo time is time from application of the excitation pulse to generation of an echo signal.

BRIEF DESCRIPTION OF THE DRAWINGS

FIG. 7 is a diagram illustrating an example of contrast enhancement imaging according to a third embodiment.

DETAILED DESCRIPTION

An MRI apparatus according to an embodiment includes an acquisition unit. The acquisition unit acquires an echo signal generated for each of intervals of repetition time by applying an excitation pulse to a subject at the intervals of repetition time, and acquires data of a plurality of trajectories set for a k-space using the echo signals. The acquisition unit acquires a plurality of echo signals by setting echo time to lengths different between a plurality of periods of repetition time, and acquires data of the same trajectory using the echo signals. The echo time serves as time from application of the excitation pulse to generation of the echo signal.

Embodiments of the MRI apparatus according to the present application will now be described in detail hereinafter with reference to drawings.

First Embodiment

Figure 1:
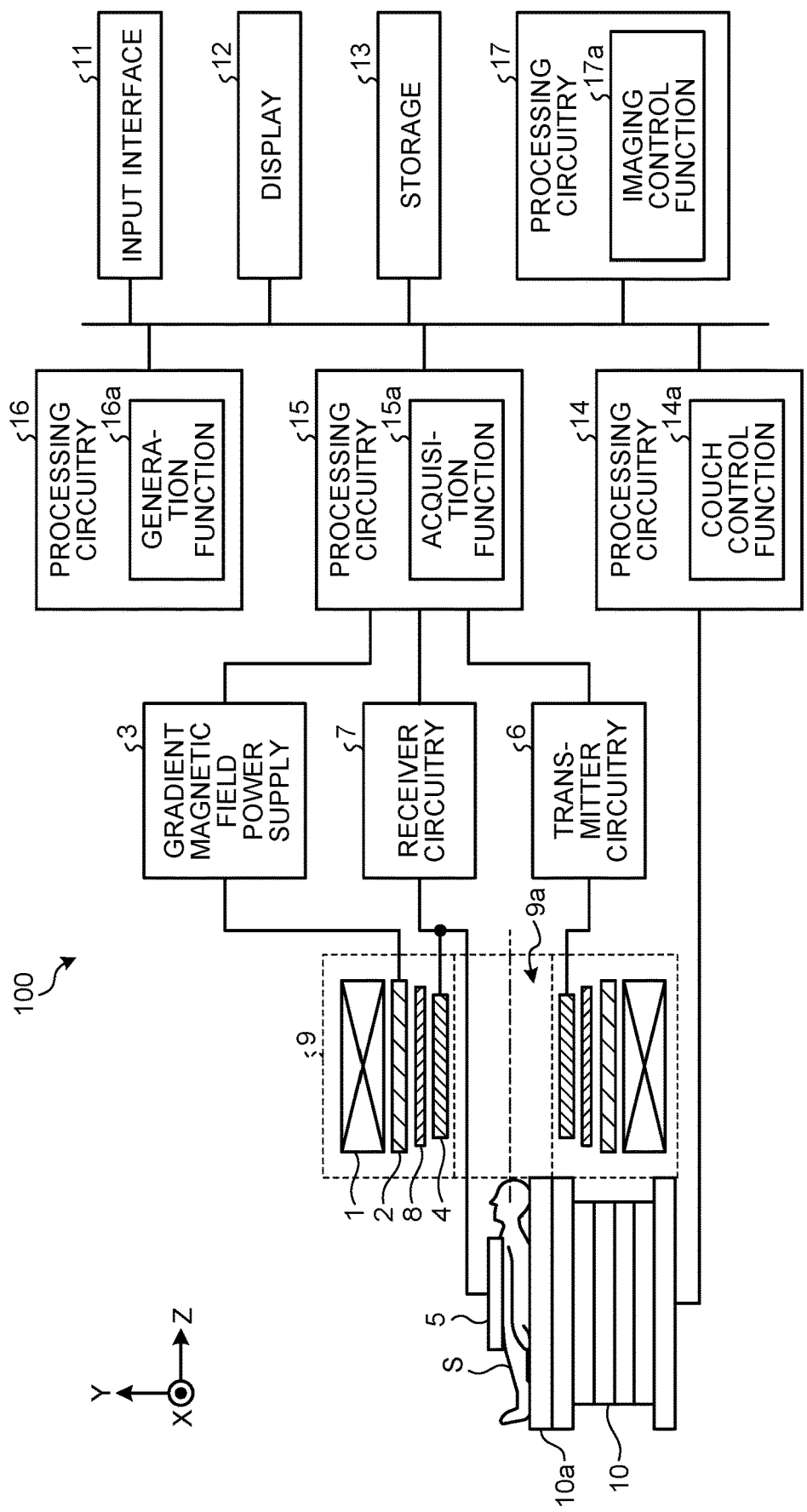
FIG. 1 is a diagram illustrating a configuration example of an MRI apparatus according to a first embodiment.

FIG. 1 is a diagram illustrating a configuration example of an MRI apparatus according to a first embodiment.

For example, as illustrated in FIG. 1, an MRI apparatus 100 includes a static magnetic field magnet 1, a gradient coil 2, a gradient magnetic field power supply 3, a whole body radio frequency (RF) coil 4, a local RF coil 5, transmitter circuitry 6, receiver circuitry 7, an RF shield 8, a gantry 9, a couch 10, an input interface 11, a display 12, a storage 13, and processing circuitries 14 to 17.

The static magnetic field magnet 1 generates a static magnetic field in an imaging space in which a subject S is disposed. Specifically, the static magnetic field magnet 1 is formed in a hollow and substantially cylindrical shape (including a shape having an oval cross-section orthogonal to the central axis), and generates a static magnetic field in the imaging space formed on an inner peripheral side thereof. For example, the static magnetic field magnet 1 is a superconducting magnet or a permanent magnet or the like. The superconducting magnet mentioned herein is formed of a vessel filled with a cooling agent, such as liquid helium, and a superconducting coil immersed in the vessel.

The gradient coil 2 is disposed inside the static magnetic field magnet 1, and generates a gradient magnetic field in the imaging space in which the subject S is disposed. Specifically, the gradient coil 2 is formed in a hollow and substantially cylindrical shape (including a shape having an oval cross-section orthogonal to the central axis), and includes an X coil, a Y coil, and a Z coil corresponding to an X axis, a Y axis, and a Z axis that are mutually orthogonal, respectively. The X coil, the Y coil, and the Z coil generate respective gradient magnetic fields linearly changing along respective axis directions in the imaging space on the basis of a current supplied from the gradient magnetic field power supply 3. The Z axis is set to extend along magnetic flux of the static magnetic field generated with the static magnetic field magnet 1. In addition, the X axis is set to extend along a horizontal direction orthogonal to the Z axis, and the Y axis is set to extend along a vertical direction orthogonal to the Z axis. In this manner, the X axis, the Y axis, and the Z axis form an apparatus coordinate system specific to the MRI apparatus 100.

The gradient magnetic field power supply 3 supplies a current to the gradient coil 2 to generate a gradient magnetic field in the imaging space. Specifically, the gradient magnetic field power supply 3 individually supplies currents to the X coil, the Y coil, and the Z coil of the gradient coil 2 to generate gradient magnetic fields linearly changing along a read-out direction, a phase encoding direction, and a slice direction that are mutually orthogonal in the imaging space. In the following explanation, the gradient magnetic field extending along the read-out direction is referred to as "read-out gradient magnetic field", the gradient magnetic field extending along the phase encoding direction is referred to as "phase encoding gradient magnetic field", and the gradient magnetic field extending along the slice direction is referred to as "slice gradient magnetic field".

The read-out gradient magnetic field, the phase encoding gradient magnetic field, and the slice gradient magnetic field are each superimposed on the static magnetic field generated with the static magnetic field magnet 1 to provide spatial positional information to a magnetic resonance signal generated from the subject S. Specifically, the read-out gradient magnetic field changes a frequency of the magnetic resonance signal in accordance with the position in the read-out direction to provide positional information along the read-out direction to the magnetic resonance signal. The phase encoding gradient magnetic field changes a phase of the magnetic resonance signal along the phase encoding direction to provide positional information along the phase encoding direction to the magnetic resonance signal. The slice gradient magnetic field provides positional information along the slice direction to the magnetic resonance signal. For example, when the imaging region is a slice region (2D imaging), the slice gradient magnetic field is used to determine the direction, the thickness, and the number of sheets of the slice region. When the imaging region is a volume region (3D imaging), the slice gradient magnetic field is used to change the phase of the magnetic resonance signal in accordance with the position in the slice direction. In this manner, the axis extending along the read-out direction, the axis extending along the phase encoding direction, and the axis extending along the slice direction form a logical coordinate system to define the slice region or the volume region serving as the target of imaging.

The whole body RF coil 4 is disposed on the inner peripheral side of the gradient coil 2, applies an RF magnetic field (such as an excitation pulse) to the subject S disposed in the imaging space, and receives a magnetic resonance signal (such as an echo signal) generated from the subject S with the RF magnetic field. Specifically, the whole body RF coil 4 is formed in a hollow and substantially cylindrical shape (including a shape having an oval cross-section orthogonal to the central axis), and applies an RF magnetic field to the subject S disposed in the imaging space positioned on the inner peripheral side thereof on the basis of an RF pulse supplied from the transmitter circuitry 6. In addition, the whole body RF coil 4 receives a magnetic resonance signal generated from the subject S by an influence of the RF magnetic field, and outputs the received magnetic resonance signal to the receiver circuitry 7.

The local RF coil 5 receives the magnetic resonance signal generated from the subject S. Specifically, the local RF coil 5 is prepared for each of regions of the subject S, and disposed in the vicinity of the surface of the region serving as the imaging target when imaging of the subject S is executed. The local RF coil 5 receives a magnetic resonance signal generated from the subject S by an influence of the RF magnetic field applied with the whole body RF coil 4, and outputs the received magnetic resonance signal to the receiver circuitry 7. The local RF coil 5 may further include a function of applying an RF magnetic field to the subject S. In such a case, the local RF coil 5 is connected to the transmitter circuitry 6, and applies an RF magnetic field to the subject S on the basis of an RF pulse supplied from the transmitter circuitry 6. For example, the local RF coil 5 is a surface coil or a phased array coil formed by combining a plurality of surface coils as coil elements.

The transmitter circuitry 6 outputs an RF pulse corresponding to a Larmor frequency specific to the target atomic nucleus placed in the static magnetic field to the whole body RF coil 4. Specifically, the transmitter circuitry 6 includes a pulse generator, an RF generator, a modulator, and an amplifier. The pulse generator generates a waveform of the RF pulse. The RF generator generates an RF signal of a resonance frequency. The modulator generates an RF pulse by modulating the amplitude of the RF signal generated with the RF generator using the waveform generated with the pulse generator. The amplifier amplifies the RF pulse generated with the modulator and outputs the amplified RF pulse to the whole body RF coil 4.

The receiver circuitry 7 generates magnetic resonance data on the basis of the magnetic resonance signal output from the whole body RF coil 4 or the local RF coil 5, and outputs the generated magnetic resonance data to the processing circuitry 15. For example, the receiver circuitry 7 includes a selector, a preamplifier, a phase detector, and an analog/digital (A/D) converter. The selector selectively receives the magnetic resonance signal output from the whole body RF coil 4 or the local RF coil 5. The preamplifier amplifies the magnetic resonance signal output from the selector. The phase detector detects the phase of the magnetic resonance signal output from the preamplifier. The A/D converter generates magnetic resonance data by converting the analog signal output from the phase detector into a digital signal, and outputs the generated magnetic resonance data to the processing circuitry 15. Each processing explained as processing executed with the receiver circuitry 7 is not always executed with the receiver circuitry 7, but part of processing (for example, processing executed with the A/D converter) may be executed with the whole body RF coil 4 or the local RF coil 5.

The RF shield 8 is disposed between the gradient coil 2 and the whole body RF coil 4, and shields the gradient coil 2 from the RF magnetic field generated with the whole body RF coil 4. Specifically, the RF shield 8 is formed in a hollow and substantially cylindrical shape (including a shape having an oval cross-section orthogonal to the central axis of the cylinder), and is disposed to cover the outer peripheral surface of the whole body RF coil 4 in the space on the inner peripheral side of the gradient coil 2.

The gantry 9 includes a hollow bore 9a formed in a substantially cylindrical shape (including a shape having an oval cross-section orthogonal to the central axis), and contains the static magnetic field magnet 1, the gradient coil 2, the whole body RF coil 4, and the RF shield 8. Specifically, the gantry 9 contains them in a state in which the whole body RF coil 4 is disposed on the outer peripheral side of the bore 9a, the RF shield 8 is disposed on the outer peripheral side of the whole body RF coil 4, the gradient coil 2 is disposed on the outer peripheral side of the RF shield 8, and the static magnetic field magnet 1 is disposed on the outer peripheral side of the gradient coil 2. A space in the bore 9a included in the gantry 9 serves as the imaging space in which the subject S is disposed in imaging.

The couch 10 includes a couchtop 10a on which the subject S is placed, and moves the couchtop 10a on which the subject S is placed into the imaging space when imaging of the subject S is executed. For example, the couch 10 is set such that the longitudinal direction of the couchtop 10a is parallel with the central axis of the static magnetic field magnet 1.

This explanation illustrates the example in the case where the MRI apparatus 100 has a tunnel-type structure in which each of the static magnetic field magnet 1, the gradient coil 2, and the whole body RF coil 4 is formed in a substantially cylindrical shape, but the embodiments are not limited thereto. For example, the MRI apparatus 100 may have an open-type structure in which a pair of static magnetic field magnets, a pair of gradient coils, and a pair of RF coils are arranged to be opposed to each other and hold therebetween an imaging space in which the subject S is disposed. In the open-type structure like this, the space held between the static magnetic field magnets, the gradient coils, and the RF coils corresponds to the bore in the tunnel-type structure.

The input interface 11 receives input operations of various types of instructions and various types of information from the operator. Specifically, the input interface 11 is connected to the processing circuitry 17, converts the input operations received from the operator into electrical signals, and outputs the electrical signals to the processing circuitry 17. For example, the input interface 11 is achieved with a track ball, a switch button, a mouse, and a keyboard to execute setting of imaging conditions and/or a region of interest (ROI), a touch pad to execute an input operation by operator's touching on the operation surface, a touch screen in which a display screen and a touch pad are integrated, a noncontact input circuitry using an optical sensor, and a voice input circuitry, and the like. In the present specification, the input interface 11 is not limited to an element including physical operation components, such as a mouse and a keyboard. For example, examples of the input interface 11 also include an electrical signal processing circuitry receiving an electrical signal corresponding to an input operation from an external input device provided separately from the apparatus, and outputting the electrical signal to the control circuitry.

The display 12 displays various types of information. Specifically, the display 12 is connected to the processing circuitry 17, converts data of various types of information transmitted from the processing circuitry 17 into display electrical signals, and outputs the electrical signals. For example, the display 12 is achieved with a liquid crystal monitor, a CRT monitor, or a touch panel, or the like.

The storage 13 stores various types of data therein. Specifically, the storage 13 is connected to the processing circuitries 14 to 17, and stores therein various types of data input and output from and to each of the processing circuitries. For example, the storage 13 is achieved with a semiconductor memory element, such as a random access memory (RAM) and a flash memory, a hard disk, or an optical disk, or the like.

The processing circuitry 14 has a couch control function 14a. The couch control function 14a controls operations of the couch 10 by outputting a control electrical signal to the couch 10. For example, the couch control function 14a receives an instruction to move the couchtop 10a in the longitudinal direction, the vertical direction, or the crosswise direction from the operator via the input interface 11, and operates the moving mechanism included in the couch 10 for the couchtop 10a to move the couchtop 10a in accordance with the received instruction.

The processing circuitry 15 has an acquisition function 15a. The acquisition function 15a acquires k-space data by executing various types of pulse sequences. Specifically, the acquisition function 15a executes various types of pulse sequences by driving the gradient magnetic field power supply 3, the transmitter circuitry 6, and the receiver circuitry 7 in accordance with sequence execution data output from the processing circuitry 17. The sequence execution data is data indicating the pulse sequence, and information specifying the timing at which the gradient magnetic field power supply 3 supplies a current to the gradient coil 2, the intensity of the supplied current, the timing at which the transmitter circuitry 6 supplies an RF pulse to the whole body RF coil 4, the intensity of the supplied radio frequency pulse, the timing at which the receiver circuitry 7 samples the magnetic resonance signal, and the like. The acquisition function 15a receives magnetic resonance data output from the receiver circuitry 7 as a result of executing the pulse sequence, and stores the magnetic resonance data in the storage 13. In this operation, the magnetic resonance data to be stored in the storage 13 is provided with positional information along the read-out direction, the phase encoding direction, and the slice direction with the respective gradient magnetic fields described above, and stored as k-space data indicating a two-dimensional or three-dimensional k-space.

The processing circuitry 16 has a generation function 16a. The generation function 16a generates an image from the k-space data acquired with the processing circuitry 15. Specifically, the generation function 16a reads the k-space data acquired with the processing circuitry 15 from the storage 13, and generates a two-dimensional or three-dimensional image by executing reconstruction, such as Fourier transform, for the read k-space data. The generation function 16a stores the generated image in the storage 13.

The processing circuitry 17 has an imaging control function 17a. The imaging control function 17a controls the whole MRI apparatus 100 by controlling each of the constituent elements included in the MRI apparatus 100. Specifically, the imaging control function 17a displays a graphical user interface (GUI) to receive input operations of various types of instructions and various types of information from the operator on the display 12, and controls each of the constituent elements included in the MRI apparatus 100 in accordance with the input operations received via the input interface 11. For example, the imaging control function 17a generates sequence execution data on the basis of imaging conditions input by the operator, and outputs the generated sequence execution data to the processing circuitry 15 to cause the processing circuitry 15 to acquire k-space data. In addition, for example, the imaging control function 17a controls the processing circuitry 16 to cause the processing circuitry 16 to reconstruct the image from the k-space data acquired with the processing circuitry 15. In addition, for example, the imaging control function 17a reads an image from the storage 13 in response to an operator's request, and displays the read image on the display 12.

The processing circuitries 14 to 17 described above are achieved with, for example, a processor. In this case, the processing functions included in the processing circuitries are, for example, stored in the storage 13 in the form of computer programs executable with a computer. The processing circuitries achieve the respective processing functions corresponding to the respective computer programs by reading the respective computer programs from the storage 13 and executing the computer programs. In other words, the processing circuitries in the state of reading the respective computer programs have the respective functions illustrated in the processing circuitries in FIG. 1.

This explanation illustrates the structure in which each of the processing circuitries is achieved with a single processor, but the embodiments are not limited thereto. Embodiments may have a structure in which each of the processing circuitries is formed by combining a plurality of independent processors and the processors achieve each of processing functions by executing the computer program. The processing functions included in the processing circuitries may be achieved in a state of being properly distributed or integrated into a single or a plurality of processing circuitries. In addition, the example illustrated in FIG. 1 illustrates that the single storage 13 stores therein computer programs corresponding to the respective processing functions, but may have a structure in which a plurality of storages are arranged in a distributed manner and the processing circuitries read out corresponding computer programs from the individual storages.

The configuration example of the MRI apparatus 100 according to the present embodiment has been described above. With the configuration described above, the MRI apparatus 100 according to the present embodiment has a function of generating a $T_2^*$map image of the subject using a technique called UTE.

UTE is a technique of acquiring an echo signal directly after an excitation pulse is applied to the subject, acquiring data of a k-space by radial acquisition using the echo signal, and generating an image. UTE is capable of drawing tissue having a short T2 or T2* relaxation time, such as a joint and a lung field, by setting echo time (TE) to a short time, for example, less than 0.1 ms. Echo time is time from application of the excitation pulse to generation of an echo signal.

In the case of generating a $T_2$* map image using UTE as described above, for example, there is a method of acquiring a plurality of pieces of data having different TEs by acquiring a plurality of echo signals while changing TE at short time intervals directly after application of the excitation pulse, and generating a $T_2$* map image by deriving $T_2$* values on the basis of the pieces of data.

However, generally, in the MRI apparatus, because the switching speed of the gradient magnetic field is restricted by dB/dt, when a plurality of echo signals are acquired at short time intervals, it is inevitably required to decrease the intensity of the gradient magnetic field. As a result, the spatial resolution is reduced. By contrast, to improve the spatial resolution of an image, it is inevitably required to extend the echo train spacing (ETS), and consequently the time resolution is reduced.

In view of them, there may be the case where the method described above cannot meet clinical demands requiring both high spatial resolution and high time resolution.

In view of the circumstances described above, the MRI apparatus 100 according to the present embodiment is configured to be capable of improving spatial resolution and time resolution in imaging of a region including tissue having a short $T_2$ or $T_2$* relaxation time.

Specifically, in the present embodiment, the acquisition function 15a of the processing circuitry 15 acquires an echo signal generated for each of intervals of repetition time (TR) by applying an excitation pulse to the subject at the intervals of TR, and acquires data of a plurality of trajectories set for the k-space using the echo signal. The acquisition function 15a acquires a plurality of echo signals with the TE set to different lengths for a plurality of periods of TR, and acquires data of the same trajectory using the echo signals.

The following is a detailed explanation of the configuration of the MRI apparatus 100 described above. The present embodiment illustrates an example in the case where the acquisition function 15a acquires data of a three-dimensional k-space by radial acquisition, and the generation function 16a generates a three-dimensional $T_2$* map image.

Figure 2:
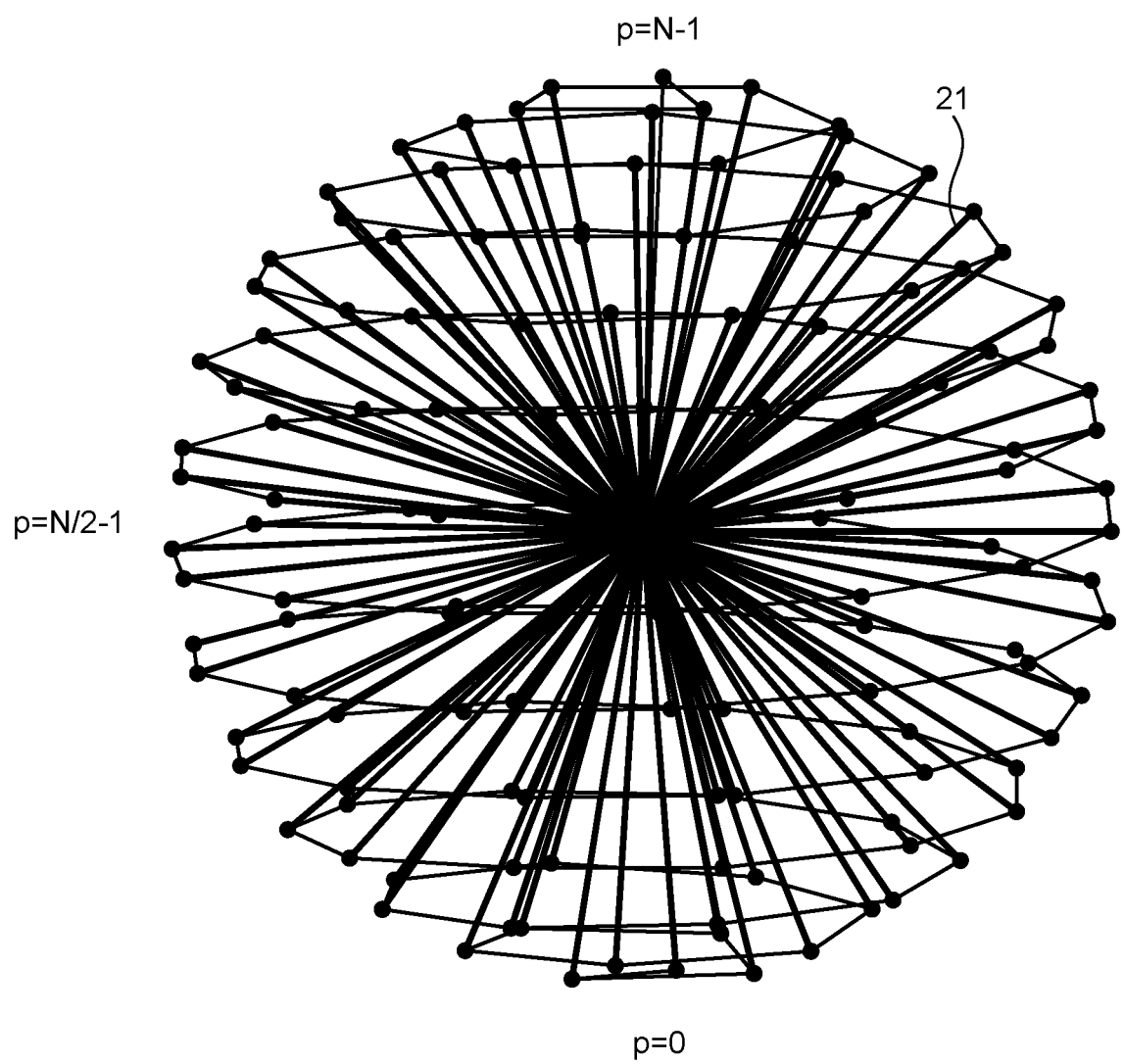
FIG. 2 is a diagram illustrating an example of trajectories of a k-space used with an acquisition function according to the first embodiment.

FIG. 2 is a diagram illustrating an example of trajectories of a k-space used with the acquisition function 15a according to the first embodiment.

For example, as illustrated in FIG. 2, the acquisition function 15a acquires data for a three-dimensional k-space along a plurality of straight-line trajectories 21 radially extending from the center of the k-space by radial acquisition.

When the total number of sampling points p acquired along a plurality of trajectories set in the k-space is N, the coordinates (x (p), y (p), z (p)) of each sampling point p is expressed with the following expressions (1) to (3).

$$z(p) = \frac{2p - N - 1}{N} \quad (1)$$

$$x(p) = \cos(\sqrt{N\pi} \sin^{-1} z(p))\sqrt{1 - z^2(p)} \quad (2)$$

-continued
$$y(p) = \sin(\sqrt{N\pi} \sin^{-1} z(p))\sqrt{1 - z^2(p)} \quad (3)$$

In addition, with respect to a plurality of trajectories, when $m_{th}$ trajectory is expressed as "Seg (m)", each of the trajectories is defined as follows. A plurality of elements included in the right side correspond to a plurality of sampling points p acquired along each trajectory.

$$Seg\ (0) = 0, m, 2m, \ldots, N - m$$
$$Seg\ (1) = 1, m + 1, 2m + 1, \ldots, N - m + 1$$
$$\vdots$$
$$Seg\ (m) = m - 1, 2m - 1, 3m - 1, \ldots, N - 1$$

Figure 3:
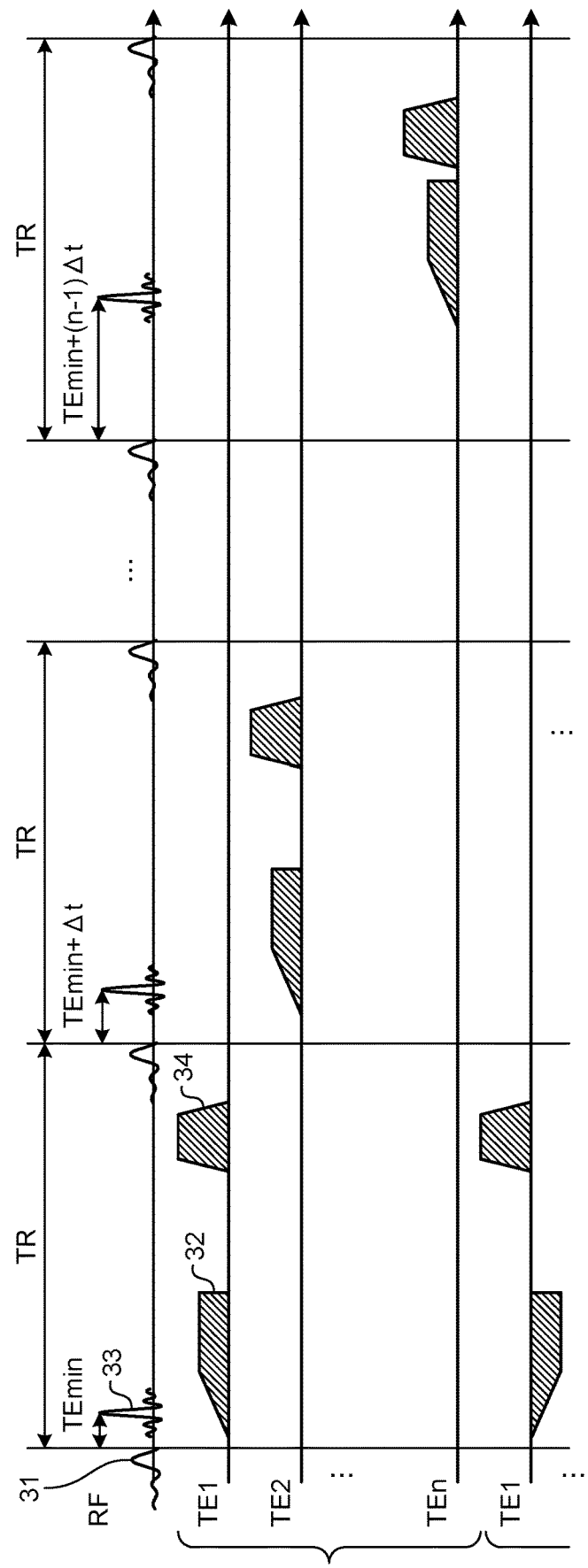
FIG. 3 is a diagram illustrating a pulse sequence used with the acquisition function according to the first embodiment.

FIG. 3 is a diagram illustrating a pulse sequence used with the acquisition function 15a according to the first embodiment.

For example, as illustrated in FIG. 3, the acquisition function 15a applies an excitation pulse 31 to the subject a plurality of times at regular intervals of TR, and acquires an echo signal 33 for each of the intervals of TR using UTE. In this operation, the acquisition function 15a acquires an echo signal 33 while applying a gradient magnetic field 32 including a read-out gradient magnetic field, a phase encoding gradient magnetic field, and a slice gradient magnetic field, and thereafter applies a spoiler gradient magnetic field 34 at timing at which certain time has passed after application of the excitation pulse 31.

In this operation, the acquisition function 15a sets the TE to different lengths by changing the TE by predetermined time in each of the periods of TR, and acquires a plurality of echo signals 33. In this operation, the acquisition function 15a acquires a plurality of echo signals 33 in an order of times that are continuous or close as much as possible.

For example, the acquisition function 15a successively changes the TE by predetermined time. In this operation, for example, the acquisition function 15a successively increases the TE by the predetermined time. As another example, the acquisition function 15a may successively decrease the TE by the predetermined time. As another example, the acquisition function 15a may increase the TE by the predetermined time and decrease the TE by the predetermined time in a mixed manner.

For example, the acquisition function 15a applies the excitation pulse 31 n times at regular intervals of TR, and changes the TE from TE1 to TEn by successively increasing the TE by Δt from TEmin for each of the intervals of TR to acquire a plurality of echo signals 33.

In this case, for example, the acquisition function 15a sets TEmin and Δt in accordance with the $T_2$ or $T_2$* relaxation time of the tissue serving as the imaging target. For example, the acquisition function 15a sets shorter TEmin and Δt as the tissue serving as the imaging target has shorter $T_2$ or $T_2$* relaxation time, and sets longer TEmin and Δt as the tissue serving as the imaging target has longer $T_2$ or $T_2$* relaxation time. In addition, for example, the acquisition function 15a sets the TR to the shortest length enabling acquisition of an echo signal of TEn serving as the longest TE.

For example, the acquisition function 15a applies the excitation pulse 31 five times, and acquires five echo signals 33 by changing the TE to 0.1 ms, 0.12 ms, 0.14 ms, 0.16 ms, and 0.18 ms for the respective periods of TR. In the case of UTE, because a magnetic resonance signal is generated by fast low-angle shot (FLASH), the signal change between the TEs can be limited to a part depending on the $T_2^*$ relaxation time by maintaining the flip angle of the excitation pulse to 5 to 10° or less and properly controlling the spoiler gradient magnetic field and the phase of the RF pulse.

Thereafter, the acquisition function 15a acquires a plurality of pieces of data having different TEs for the same trajectory in the trajectories set in the k-space using the echo signals 33 acquired by changing the TE.

Thereafter, the acquisition function 15a repeats acquisition of a plurality of echo signals 33 while changing the solid angle of the trajectory by changing the allocation of the read-out gradient magnetic field, the phase encoding gradient magnetic field, and the slice gradient magnetic field included in the gradient magnetic field 32. In this manner, the acquisition function 15a acquires a plurality of pieces of data having different TEs for each of all the trajectories set in the k-space.

In this operation, for example, the acquisition function 15a may acquire data by executing decimation by setting the trajectory with an angle called "golden angle". As another example, the acquisition function 15a may acquire data by dividing the k-space into a plurality of segments using respiratory-gated imaging or the like together and executing decimation for the number of segments.

In the present embodiment, the generation function 16a of the processing circuitry 16 generates a $T_2^*$ map image by deriving the $T_2^*$ values using a known technique, such as curve fitting, on the basis of a plurality of pieces of data acquired with the acquisition function 15a and having different TEs.

Figure 4:
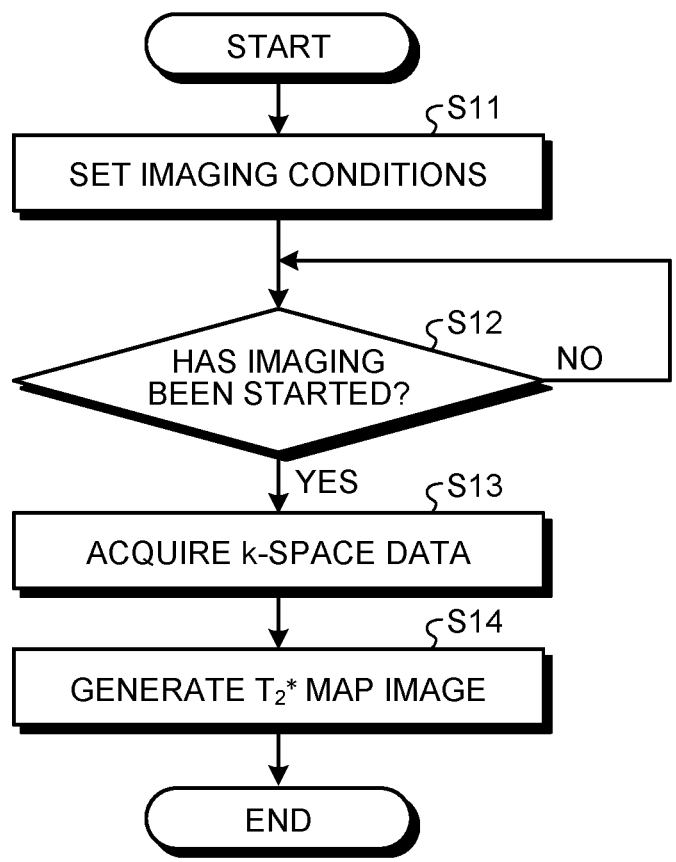
FIG. 4 is a flowchart illustrating a processing procedure of an imaging method executed with the MRI apparatus according to the first embodiment.

FIG. 4 is a flowchart illustrating a processing procedure of an imaging method executed with the MRI apparatus 100 according to the first embodiment.

For example, as illustrated in FIG. 4, in the present embodiment, the imaging control function 17a sets imaging conditions including the TE and/or the TR used in imaging, on the basis of an input from the operator (Step S11). When the imaging control function 17a receives an instruction to start imaging from the operator (Yes at Step S12), the imaging control function 17a starts the following processing.

First, the acquisition function 15a acquires a plurality of echo signals with the TE set to lengths different between a plurality of periods of TR as described above on the basis of the imaging conditions set with the imaging control function 17a, and acquires k-space data by a method of acquiring data of the same trajectory using the echo signals (Step S13).

Thereafter, the generation function 16a generates a $T_2^*$ map image on the basis of the k-space data acquired with the acquisition function 15a (Step S14).

The processing at Step S11 and Step S12 described above is achieved with the processing circuitry 17 by, for example, reading a predetermined computer program corresponding to the imaging control function 17a from the storage 13 and executing the computer program. The processing at Step S13 described above is achieved with the processing circuitry 15 by, for example, reading a predetermined computer program corresponding to the acquisition function 15a from the storage 13 and executing the computer program. The processing at Step S14 described above is achieved with the processing circuitry 16 by, for example, reading a predetermined computer program corresponding to the generation function 16a from the storage 13 and executing the computer program.

As described above, in the first embodiment, the acquisition function 15a acquires an echo signal generated for each of intervals of TR by applying an excitation pulse to the subject at intervals of TR, and acquires data of a plurality of trajectories set for the k-space using the echo signal. The acquisition function 15a acquires a plurality of echo signals by setting TE to lengths different between a plurality of periods of TR, and acquires data of the same trajectory using the echo signals.

This structure enables the use of a gradient magnetic field of high intensity without restriction caused by dB/dt by acquiring an echo signal for each of periods of TR, and enables improvement of spatial resolution. This structure also enables a reduction in time difference of TEs by changing the TE for each of intervals of TR, and enables improvement of time resolution.

Accordingly, the present embodiment enables improvement of spatial resolution and time resolution in imaging of a region including tissue having short $T_2$ or $T_2^*$ relaxation time.

In addition, the present embodiment enables suppression of influence of motion and/or flow in the region serving as the imaging target to the minimum by acquiring data of the same trajectory using a plurality of echo signals acquired in an order of times that are continuous or close as much as possible by changing the TE.

In addition, the imaging method according to the present embodiment has the advantage of very little change in waveform of the gradient magnetic field between two TEs. In a conventional method, when the region having motion and flow is imaged, the sensitivity to motion and/or flow largely changes due to the effect of gradient moment (GM) serving as a phase component generated with the gradient magnetic field. By contrast, in the imaging method according to the present embodiment, the waveform of the gradient magnetic field scarcely changes between two TEs, and the sensitivity to motion and/or flow is maintained.

The acquisition time required for acquisition of data necessary for generating a $T_2^*$ map image in the case of acquiring a plurality of echo signals with one excitation pulse by an ordinary multiecho method (hereinafter referred to as "conventional method") will be compared with that in the case of acquiring a plurality of echo signals with the TE changed by the imaging method according to the present embodiment. In this example, the acquisition time is compared between the case where the number of echo signals used for data acquisition for one trajectory in the conventional method is set to 5 and each of the echo intervals is set to 1.5 ms and the case where the number of echo signals used for data acquisition for one trajectory in the imaging method according to the present embodiment is set to 5 and the variable range of the TE is set to 2.5 ms or less.

In this case, in the conventional method, the TR is 9 ms or around, and the acquisition time is 180 s when the number of trajectories is 20000. By contrast, in the imaging method according to the present embodiment, the TR is 4 ms or around, and the acquisition time is "80 s×5=400 s" or around when the number of trajectories is 20000 like the conventional method. In this case, the acquisition time of the present embodiment is at least twice as long as that of the conventional method.

However, in consideration of the $T_2^*$ relaxation time being 2 ms or less of the fibrosing region and/or the tendon of the locomotorium or the like serving as the imaging target, it is assumed that the measurement accuracy is not high in the conventional method due to signal attenuation.

The imaging method according to the present embodiment enables measurement with high accuracy.

For example, as a simple comparison, when two TEs are considered, TEs in the conventional method are 0.1 ms and 1.6 ms and attenuation between them is imaged. In the imaging method according to the present embodiment, the first TE is set to 0.1 ms and the second TE can be selected from the range of 0.2 ms to 1.6 ms or around as desired, and the degree of freedom of clinical application expands.

In addition, in this case, when the number of trajectories is set to 20000 in both of the methods, the TR is 4 ms or around in the conventional method and the acquisition time is 80 s. In the method according to the present embodiment, when the second TE is set to 0.5 ms and the TR is 2.5 ms, the acquisition time is "50 s×2=100 s". However, it is considered that the disadvantage caused for improvement of accuracy due to extension of the imaging time is not large.

In addition, a plurality of echo signals acquired with TE changed by the imaging method according to the present embodiment have the same acquisition order and/or form as those of echo signals acquired in the conventional method, and enable the use of data acquisition and/or framework (such as the method for using a buffer memory) of image reconstruction used in the conventional method without any change.

The first embodiment has been described above, but embodiments of the MRI apparatus according to the present application are not limited thereto. For this reason, another embodiment according to the MRI apparatus according to the present application will be explained hereinafter. The following embodiment mainly illustrates points different from those of the first embodiment, and an explanation of details shared with the first embodiment is omitted.

Second Embodiment

First, the first embodiment described above illustrates an example in the case where one echo signal is acquired in one TR, but embodiments are not limited thereto.

For example, the acquisition function 15a may acquire a plurality of first echo signals with TE set to lengths different between a plurality of periods of TR, further acquire a plurality of second echo signals with the TE set to a fixed length in each of the periods of TR, and acquire data of the same trajectory using the acquired first echo signals and the second echo signals.

Figure 5:
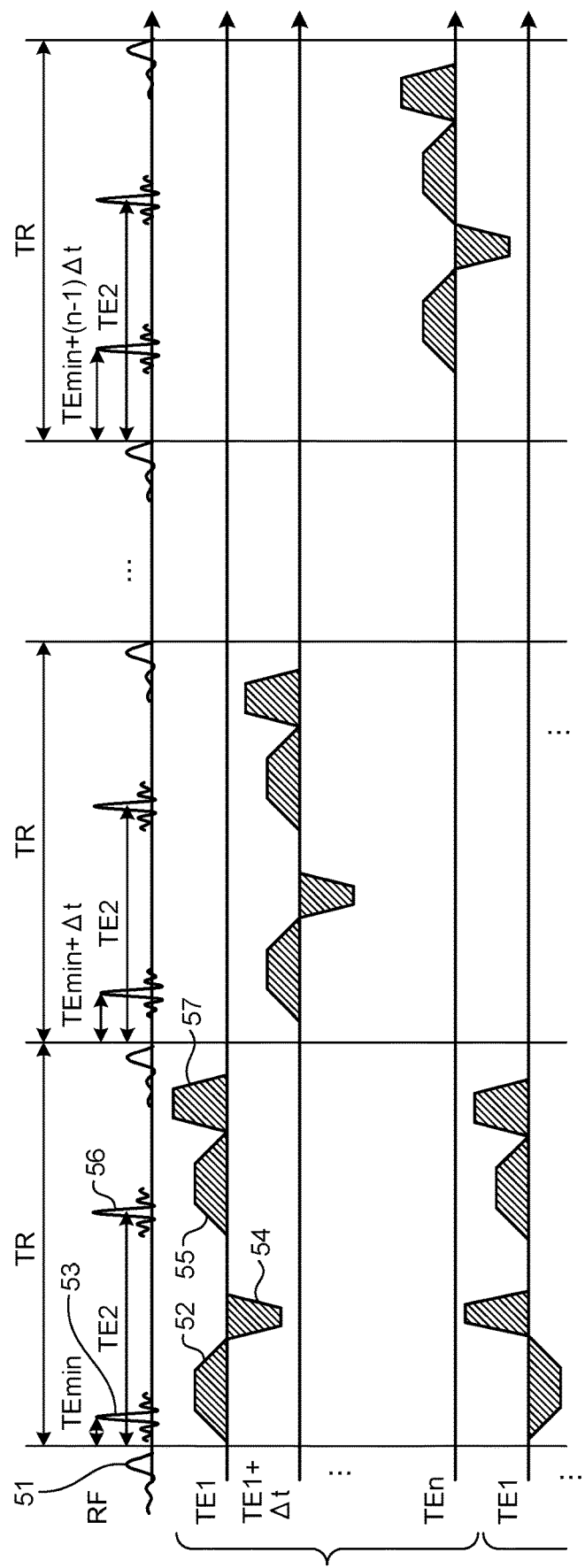
FIG. 5 is a diagram illustrating a pulse sequence used with an acquisition function according to a second embodiment.

FIG. 5 is a diagram illustrating a pulse sequence used with the acquisition function 15a according to the second embodiment.

For example, as illustrated in FIG. 5, the acquisition function 15a applies an excitation pulse 51 to the subject a plurality of times at regular intervals of TR, and acquires a first echo signal 53 for each of the intervals of TR using UTE. In this operation, the acquisition function 15a acquires the first echo signal 53 while applying a gradient magnetic field 52 including a read-out gradient magnetic field, a phase encoding gradient magnetic field, and a slice gradient magnetic field, and thereafter applies a rewinder gradient magnetic field 54.

In this operation, in the same manner as the first embodiment, the acquisition function 15a sets the TE to different lengths by changing the TE by predetermined time in each of the periods of TR, and acquires a plurality of first echo signals 53.

In addition, the acquisition function 15a acquires a second echo signal 56 for each of the intervals of TR by gradient echo (GRE) method, after the rewinder gradient magnetic field 54 is applied. In this operation, the acquisition function 15a acquires the second echo signal 56 by applying a gradient magnetic field 55 including a read-out gradient magnetic field, a phase encoding gradient magnetic field, and a slice gradient magnetic field, and thereafter applies a spoiler gradient magnetic field 57 at timing at which certain time has passed after application of the excitation pulse 31.

In this operation, the acquisition function 15a acquires a plurality of second echo signals 56 with the TE set to the fixed length in each of the periods of TR.

For example, the acquisition function 15a acquires a plurality of first echo signals 53 with the TE changed to five levels of 0.1 ms to 2.5 ms, and acquires a plurality of second echo signals 56 with the TE set to 4 ms or around.

Thereafter, the acquisition function 15a acquires a plurality of pieces of data having the different TEs for the same trajectory in trajectories set in the k-space using the first echo signals 53 acquired with the changed TE and the second echo signals 56 acquired with the fixed TE.

For example, the acquisition function 15a divides the k-space into a central region and a peripheral region, acquires data for the range included in the central region using the first echo signals, and acquires data for the range included in the peripheral region using the second echo signals, for each of the trajectories.

In this operation, for example, the acquisition function 15a uses an imaging method called "keyhole method" to acquire a plurality of pieces of data for the range of the central region of the k-space to determine the contrast using the first echo signals 53 acquired with the changed TE, while acquiring a plurality of pieces of data for the range of the peripheral region of the k-space using the second echo signals acquired with the fixed TE in common in the same trajectory, for each of the trajectories.

As described above, according to the second embodiment, the acquisition function 15a acquires a plurality of first echo signals with TE set to lengths different between a plurality of periods of TR, further acquires a plurality of second echo signals with the TE set to a fixed length in each of the periods of TR, and acquires data of the same trajectory using the acquired first echo signals and the second echo signals. In addition, the acquisition function 15a divides the k-space into a central region and a peripheral region, acquires data for the range included in the central region using the first echo signals, and acquires data for the range included in the peripheral region using the second echo signals, for each of the trajectories.

The present embodiment enables such an acquisition pattern, because the positions occupying on the k-space can be controlled independently with respect to the first echo signals and the second echo signals. In addition, with respect to the first echo signals having restrictions on time resolution, it is required to use wide band as an acquisition band, that is, it is required to use a gradient magnetic field of high intensity. By contrast, the second echo signals having degree of freedom for setting of the TE and TR time, it is possible to adopt control using a narrow band as an acquisition band, that is, control to reinforce the SNR using a relatively weak gradient magnetic field.

This structure enables shortening of the acquisition time required for acquisition of data necessary for generating a $T_2^*$ map image by using the second echo signals acquired with the fixed TE in common in the same trajectory.

This structure enables, for example, acquisition of echo signals of five TEs with the acquisition time of 120 s when the number of trajectories is 20000, although the TR is extended to 6 ms. This structure increases the sampling point density with a short TE, and is expected to improve accuracy relating to calculation of the $T_2^*$ values by acquiring a relatively long TE.

Modification of Second Embodiment

The second embodiment described above can be applied to an imaging method called "pointwise encoding time reduction with radial acquisition (PETRA)".

PETRA is an imaging method using UTE, and an imaging method capable of improving spatial resolution by acquiring data for each of points by Cartesian acquisition for the central region of the k-space and acquiring data for the peripheral region of the k-space by radial acquisition.

Figure 6:
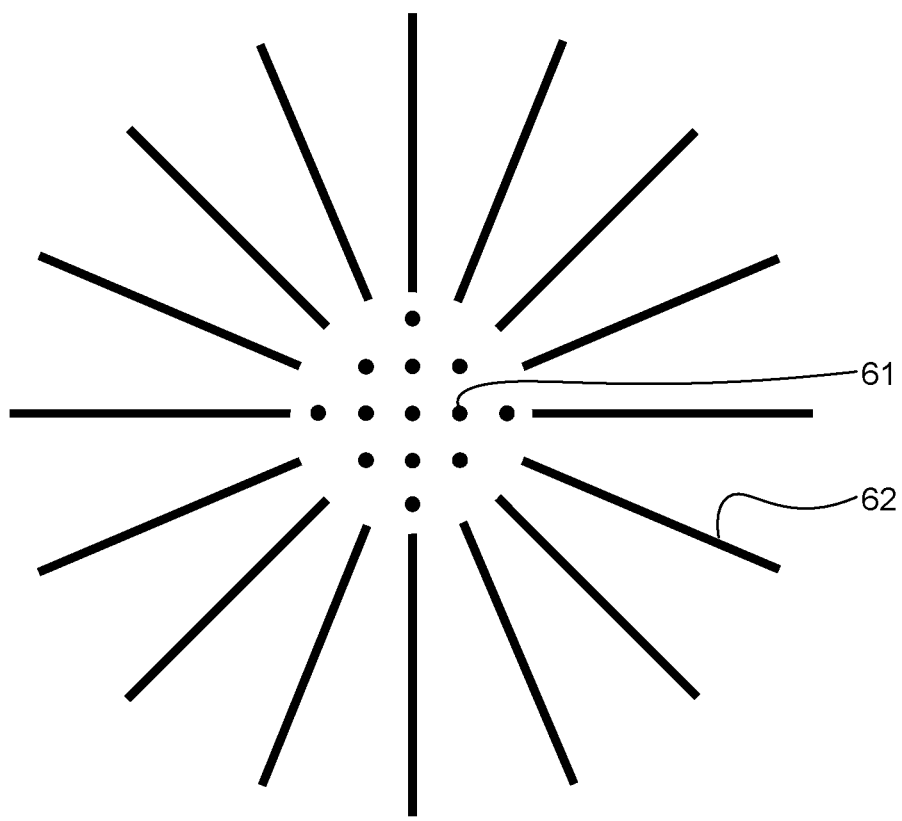
FIG. 6 is a diagram illustrating an example of trajectories of a k-space used with the acquisition function according to a modification of the second embodiment.

FIG. 6 is a diagram illustrating an example of trajectories of the k-space used with the acquisition function 15a according to a modification of the second embodiment.

For example, as illustrated in FIG. 6, in PETRA, the k-space is divided into the central region and the peripheral region, data is acquired for each of points 61 in the central region by Cartesian acquisition, and data is acquired for the peripheral region along straight lines 62 radially extending from the center of the k-space by radial acquisition.

In this case, in the same manner as the second embodiment described above, the acquisition function 15a sets TE to lengths different between a plurality of periods of TR to acquire a plurality of first echo signals, sets TE to a fixed length in each of the periods of TR to acquire a plurality of second echo signals, and acquire data of the same trajectory using the acquired first echo signals and the second echo signals.

For example, the acquisition function 15a acquires a plurality of echo signals while increasing TE from 0.1 ms by 0.1 ms for each of periods of TR.

In addition, the acquisition function 15a divides the k-space into the central region and the peripheral region, acquires data for each of the points 61 in the range included in the central region by Cartesian acquisition using the first echo signals, and acquires data for the range included in the peripheral region along the straight lines 62 radially extending from the center of the k-space by radial acquisition using the second echo signals.

In this operation, for example, the acquisition function 15a sets the ratio of the central region to the peripheral region in the k-space and/or the number of sampling points set in each of the regions, in accordance with the region serving as the imaging target.

In addition, the acquisition function 15a acquires a plurality of pieces of data for the range of the central region of the k-space to determine contrast using the first echo signals 53 acquired with the changed TE, while acquiring a plurality of pieces of data for the range of the peripheral region of the k-space using the second echo signals acquired with the fixed TE in common in the same trajectory, for each of the trajectories, in the same manner as the keyhole method.

The second embodiment and the modification described above illustrate the example in the case of acquiring two echo signals in one TR, but the number of echo signals acquired in one TR is not limited thereto. For example, the acquisition function 15a may further acquire one or more echo signals after the second echo signal in each of the periods of TR. In this case, the acquisition function 15a acquires each of the echo signals acquired for or after the second echo signal with fixed TE for each of periods of TR.

Third Embodiment

The imaging method explained in each of the embodiments described above is also applicable to contrast enhancement imaging in which imaging is executed with a signal of a specific tissue enhanced or suppressed.

The contrast enhancement imaging is a method of acquiring data of the k-space at point in time when predetermined waiting time has passed after application of a prep-pulse enhancing or suppressing the signal of the specific tissue to the subject. Examples of such contrast enhancement imaging include a time-spatial labeling inversion pulse (time-SLIP) method and a fat saturation method. The time-SLIP method is a method of visualizing flow and/or movement of blood and/or CSF and the like by applying a labeling pulse to label the blood and/or CSF. The fat saturation method is a method of suppressing a signal of the imaged fat by applying a fat saturating pulse to selectively saturating spin of fat.

In this case, the acquisition function 15a acquires data of a plurality of trajectories set in the k-space at point in time at which predetermined waiting time has passed after application of a prep-pulse enhancing or suppressing the signal of the specific tissue to the subject.

FIG. 7 is a diagram illustrating an example of contrast enhancement imaging according to the third embodiment.

For example, as illustrated in FIG. 7, at point in time at which predetermined waiting time has passed after application of a prep-pulse 71 enhancing or suppressing a signal of a specific tissue to the subject, the acquisition function 15a applies an excitation pulse 72 a plurality of times at regular intervals of TR for each of trajectories set in the k-space to successively execute loops (TR*n illustrated in FIG. 7) to acquire a plurality of echo signals 73 by changing the TE for each of the intervals of TR, as explained in the embodiments described above.

When the region serving as the imaging target is imaged in a plurality of time phases, the acquisition function 15a applies a prep-pulse a plurality of times at predetermined time intervals ("Trepeat" illustrated in FIG. 7), and successively execute the loops described above for each of the time intervals.

Other Embodiments

The second and the third embodiments described above illustrate the example in the case of acquiring data of the range included in the central region of the k-space using first echo signals and acquiring data of the range included in the peripheral region of the k-space using second echo signals, but embodiments are not limited thereto.

For example, the imaging methods explained in the second and the third embodiments are also applicable to the case of imaging an in-phase image and an out-of-phase image in inspection of the abdomen.

The in-phase image is an image acquired by setting TE such that a frequency difference between water and fat has the same phase, and the out-of-phase image is an image acquired by setting TE such that a frequency difference between water and fat has an opposite phase.

In this case, the acquisition function 15a acquires a plurality of first echo signals with TE set to lengths different between a plurality of periods of TR, further acquires a plurality of second echo signals with the TE set to a fixed length in each of the periods of TR, and acquires data of the same trajectory using the acquired first echo signals and the second echo signals, in the same manner as the second and the third embodiments described above.

In addition, the acquisition function 15a acquires data to generate the in-phase image using the first echo signals, and acquires data to generate the out-of-phase image using the second echo signals. As another example, the acquisition function 15a may acquire data to generate the out-of-phase image using the first echo signals, and acquire data to generate the in-phase image using the second echo signals. In particular, in the case where a time difference between in-phase and out-of-phase is small (for example, 0.95 ms in 7 T) with the static magnetic field intensity of 3 T or more, this structure is highly effective and is capable of suppressing fluctuations in influence of flow due to GM as described above to the minimum.

Each of the embodiments described above illustrates the example in the case of acquiring data of a three-dimensional k-space to generate a three-dimensional image, but the embodiments are not limited thereto. For example, the imaging methods explained in the embodiments are also applicable to the case of acquiring data of a two-dimensional k-space to generate a two-dimensional image.

In addition, each of the embodiments described above illustrates the example in the case where the acquisition unit in the present specification is achieved with the acquisition function 15a of the processing circuitry 15, but the embodiments are not limited thereto. For example, the acquisition unit in the present specification may achieve the function only with hardware, only with software, or with a combination of hardware and software, as well as the structure achieved with the acquisition function 15a described in the embodiments.

The explanation described above illustrates the example in which the "processor" reads computer programs corresponding to the processing functions from the storage and executes the computer programs, but the embodiments are not limited thereto. The term "processor" means a circuit, such as a central processing unit (CPU), a graphics processing unit (GPU), an application specific integrated circuit (ASIC), a programmable logic device (such as a simple programmable logic device (SPLD), a complex programmable logic device (CPLD), and a field programmable gate array (FPGA)). For example, when the processor is a CPU, the processor achieves each of the processing functions by reading and executing a corresponding computer program stored in the storage. By contrast, when the processor is an ASIC, the processing function is directly integrated as the logic circuit into the circuit of the processor, instead of storing a computer program in the storage. Each of the processors according to the present embodiment is not limited to the case where each of the processors is configured as a single circuit, but a processor may be formed by combining a plurality of independent circuits to achieve the processing function. In addition, the constituent elements in FIG. 1 may be integrated into a processor to achieve the processing functions.

Each of the computer programs executed with a processor is provided in a state of installed in advance in a read only memory (ROM) and/or a storage. Each of the computer programs may be provided in a state of being recorded on a computer-readable storage medium, such as a compact disc (CD)-ROM, a flexible disk (FD), a CD-R (recordable), and a digital versatile disc (DVD), in a file of a form installable or executable in these devices. Each of the computer programs may be stored on a computer connected to a network, such as the Internet, and provided or distributed by being downloaded via the network. For example, each of the computer programs is formed of a module including the corresponding functional unit described above. As actual hardware, the CPU reads and executes the computer program from the storage medium, such as a ROM. In this manner, each of the modules is loaded into the main storage device and generated on the main storage device.

At least one of the embodiments described above enables improvement of spatial resolution and time resolution in imaging of a region having tissue with short $T_2$ or $T_2^*$ relaxation time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
processing circuitry configured to apply an excitation pulse to a subject at each of a plurality of periods of repetition time, acquire a plurality of echo signals respectively generated for the plurality of periods of repetition time, and acquire data of a plurality of trajectories set for a k-space using the plurality of echo signals, wherein
the processing circuitry acquires the plurality of echo signals by setting echo time to lengths different between the plurality of periods of repetition time, and acquires data of a same trajectory of the plurality of trajectories using the plurality of echo signals being different in the length of the echo time, the echo time being a time from application of the excitation pulse to generation of the echo signal.

2. The magnetic resonance imaging apparatus according to claim 1, wherein the processing circuitry sets the echo time to the different lengths by changing the echo time by predetermined time in each of the periods of repetition time, and acquires the echo signals.

3. The magnetic resonance imaging apparatus according to claim 2, wherein the processing circuitry successively changes the echo time by the predetermined time.

4. The magnetic resonance imaging apparatus according to claim 3, wherein the processing circuitry successively increases the echo time by the predetermined time, successively decreases the echo time by the predetermined time, or increases the echo time by the predetermined time and decreases the echo by the predetermined time in a mixed manner.

5. The magnetic resonance imaging apparatus according to claim 1, wherein the processing circuitry acquires a plurality of first echo signals with the echo time set to lengths different between a plurality of periods of repetition time, further acquires a plurality of second echo signals with the echo time set to a fixed length in each of the periods of repetition time, and acquires data of the same trajectory using the first echo signals and the second echo signals.

6. The magnetic resonance imaging apparatus according to claim 5, wherein the processing circuitry divides the k-space into a central region and a peripheral region, acquires data for a range included in the central region using the first echo signals, and acquires data for a range included in the peripheral region using the second echo signals, for each of the trajectories.

7. The magnetic resonance imaging apparatus according to claim 5, wherein the processing circuitry divides the k-space into a central region and a peripheral region, acquires data for each of points in a range included in the central region by Cartesian acquisition using the first echo signals, and acquires data for a range included in the peripheral region along straight lines radially extending from center of the k-space by radial acquisition using the second echo signals.

8. The magnetic resonance imaging apparatus according to claim 1, wherein the processing circuitry acquires the data of the trajectories at point in time at which predetermined waiting time has passed after application of a prep-pulse enhancing or suppressing a signal of a specific tissue to the subject.

9. A magnetic resonance imaging apparatus comprising:
processing circuitry configured to acquire an echo signal generated for each of intervals of repetition time by applying an excitation pulse to a subject at the intervals of repetition time, and acquire data of a plurality of trajectories set for a k-space using the echo signals, wherein
the processing circuitry acquires a plurality of echo signals by setting echo time to lengths different between a plurality of periods of repetition time, and acquires data of a same trajectory using the echo signals, the echo time being a time from application of the excitation pulse to generation of the echo signal, and
the processing circuitry acquires a plurality of first echo signals with the echo time set to lengths different between a plurality of periods of repetition time, further acquires a plurality of second echo signals with the echo time set to a fixed length in each of the periods of repetition time, and acquires data of the same trajectory using the first echo signals and the second echo signals.

10. The magnetic resonance imaging apparatus according to claim 9, wherein the processing circuitry divides the k-space into a central region and a peripheral region, acquires data for a range included in the central region using the first echo signals, and acquires data for a range included in the peripheral region using the second echo signals, for each of the trajectories.

11. The magnetic resonance imaging apparatus according to claim 9, wherein the processing circuitry divides the k-space into a central region and a peripheral region, acquires data for each of points in a range included in the central region by Cartesian acquisition using the first echo signals, and acquires data for a range included in the peripheral region along straight lines radially extending from center of the k-space by radial acquisition using the second echo signals.

* * * * *